United States Patent
Lee et al.

(10) Patent No.: US 7,124,810 B2
(45) Date of Patent: Oct. 24, 2006

(54) HEAT PIPE HAVING WICK STRUCTURE

(75) Inventors: Hsin-Ho Lee, Tu-Cheng (TW); Wei-Jian Liao, Tu-Cheng (TW)

(73) Assignee: Hon Hai Precision Industry Co., Ltd., Taipei Hsien (TW)

( * ) Notice: Subject to any disclaimer, the term of this patent is extended or adjusted under 35 U.S.C. 154(b) by 0 days.

(21) Appl. No.: 11/106,973

(22) Filed: Apr. 15, 2005

(65) Prior Publication Data
US 2006/0016580 A1 Jan. 26, 2006

(30) Foreign Application Priority Data
Jul. 20, 2004 (CN) .................. 2004 1 0050818

(51) Int. Cl.
*F28D 15/04* (2006.01)
*H01L 23/34* (2006.01)

(52) U.S. Cl. .............................. 165/104.26; 165/104.21
(58) Field of Classification Search .......... 165/104.21, 165/104.22; 361/104.26, 700; 29/890.032; 257/715; 174/15.2; 977/962
See application file for complete search history.

(56) References Cited

U.S. PATENT DOCUMENTS

| 3,587,725 | A | * | 6/1971 | Basiulis ................. 165/104.26 |
| 3,681,843 | A | * | 8/1972 | Arcella et al. ................. 29/423 |
| 3,750,745 | A | * | 8/1973 | Moore, Jr. ............. 165/104.26 |
| 3,754,594 | A | * | 8/1973 | Ferrell ........................ 165/272 |
| 3,786,861 | A | * | 1/1974 | Eggers .................. 165/104.26 |
| 4,274,479 | A | | 6/1981 | Eastman |
| 6,899,165 | B1 | * | 5/2005 | Wu ....................... 165/104.26 |
| 2003/0178184 | A1 | * | 9/2003 | Kroliczek et al. ...... 165/104.26 |
| 2003/0186043 | A1 | * | 10/2003 | Koslow ................... 428/306.6 |
| 2005/0092467 | A1 | * | 5/2005 | Lin et al. ............... 165/104.26 |

FOREIGN PATENT DOCUMENTS

JP            55077351 A  *  6/1980

* cited by examiner

*Primary Examiner*—Tho Duong
(74) *Attorney, Agent, or Firm*—Tim Tingkang Xia; Morris Manning Martin LLP

(57) ABSTRACT

A heat pipe (20) includes a pipe (21), a wick (22) formed on an inner wall (23) of the pipe, and a working fluid (not shown) sealed in the pipe and soaked in the wick. The wick is formed by sintering nano-size metal powder disposed inside the pipe. First through holes (25) are defined in the wick in an evaporator section (20a) of the heat pipe. A central one of the first through holes is aligned along an axis 20c of the heat pipe, and other first through holes are parallel to the axis 20c. A second through hole (26) is defined in the wick in a condenser section (20b) of the heat pipe. The second through hole communicates with the first through holes, whereby the working fluid flows through the first and second through holes. These characteristics give the wick low thermal resistance, a high evaporator surface area, and high capillary force.

18 Claims, 3 Drawing Sheets

HEAT PIPE HAVING WICK STRUCTURE

BACKGROUND OF THE INVENTION

1. Technical Field

The present invention relates generally to heat transfer devices, and more specifically to heat pipes having wick structures.

2. Related Art

A typical heat pipe transports heat in the form of latent heat of a working fluid thereof. The heat pipe is made of a heat conducting material. In assembly, air is evacuated from the heat pipe, a condensable fluid such as water is filled in the heat pipe, and then the heat pipe is sealed. The heat pipe is essentially a receptacle (container) which transports heat as latent heat of the working fluid therein. Heat input from outside the heat pipe evaporates the working fluid, the vapor flows to a condenser section of the heat pipe having a low temperature and a low pressure, the vapor condenses, and the released heat radiates from the condenser section of the heat pipe. Because the heat is transmitted in the form of latent heat of the working fluid, the heat pipe has from more than ten times to several hundred times the heat transmitting capacity of that of copper, which is generally considered to have the highest heat conductivity among common metals.

The evaporated vapor phase working fluid flows to the condenser section due to the temperature and pressure differentials. After the heat is released, in a typical heat pipe, the condensed liquid phase working fluid is refluxed to the evaporator section by capillary action of a wick contained within the heat pipe.

Referring to FIGS. 4 and 5, a conventional heat pipe 10 includes a pipe 11, a wick 12 formed on an inner wall 17 of the pipe 11, and a working fluid 13. The working fluid 13 is sealed in the pipe 11 and soaked in the wick 12. Before filling the wick 12 with the working fluid 13 and sealing the pipe 11, the inside of the pipe 11 has to be evacuated. The pipe 11 has two end sections. One of the end sections is an evaporator section 10a (a heating section). The other end section is a condenser section 10b (a cooling section). An adiabatic section may be provided between the evaporator and condenser sections, according to practical need. A vapor 14 of the working fluid 13 in the wick 12 is generated by the working fluid 13 being heated at the evaporator section 10a of the heat pipe 10. The vapor 14 flows through a hole 16 to the condenser section 10b where the temperature and the pressure are low. Then, the heat 15 is dispersed from the vapor 14 at the condenser section 10b, and the vapor 14 is condensed and liquefied back to working fluid 13. After that, the working fluid 13 is refluxed to the evaporator section 10a by capillary action of the wick 12. According to this system, the heat 15 is taken continuously from the evaporator section 10a of the heat pipe 10 to the condenser section 10b of the heat pipe 10, and is dissipated at the condenser section 10b.

The wick is essentially a member for creating capillary pressure. Therefore, it is preferable that the wick 12 has excellent so-called hydrophilicity with the working fluid. Further, it is preferable that the wick has an effective radius of a capillary tube as small as possible at a meniscus of the liquid phase working fluid. In this connection, a porous sintered compact or a bundle of extremely thin wires is generally employed as the wick. The porous sintered compact may create great capillary pressure, i.e. pumping force acting on the liquid phase working fluid, because the dimensions of the openings of its cavities are smaller than those of other wicking structures such as thin wires. Further, the porous sintered compact can be formed into a seat shape, so that it is easily employed in the vapor chamber of a flat plate type heat pipe or the like. Accordingly, the porous sintered compact is viewed by many as the preferred wicking material.

A sintered wick made from sintered metal powders and sintered ceramic powders is disclosed in U.S. Pat. No. 4,274,479. A heat pipe capillary wick constructed from a sintered metal cylinder is formed in close contact with an inner wall of a heat pipe casing. Longitudinal grooves are defined in an inner surface of the wick, adjacent to a vapor space of the heat pipe casing. The grooves provide longitudinal capillary pumping, while the high capillary pressure of the sintered wick provides liquid to fill the grooves. This structure assures effective circumferential distribution of liquid in the heat pipe. However, because of the large particle size of the powder and small evaporator surface area of the sintered wick, the wick has relatively high thermal resistance and low heat transfer capacity. In particular, because only one axis hole is defined within the heat pipe casing, the sintered wick has only a single inner circumference communicating with the vapor space. This provides only a relatively small evaporator surface area.

What is needed, therefore, is a heat pipe with low thermal resistance, a high evaporator surface area, high capillary force, and good heat transfer capability.

SUMMARY

A heat pipe includes a pipe, a wick formed on an inner wall of the pipe, and a working fluid sealed in the pipe and soaked in the wick. First through holes are defined in the wick in an evaporator section of the heat pipe. A central one of the first through holes is aligned along an axis of the heat pipe, and the other first through holes are parallel to the axis. A second through hole is defined in the wick in a condenser section of the heat pipe. The second through hole is aligned along the axis and communicates with the first through holes, whereby the working fluid flows through the first and second through holes.

A radial size of the first through holes in cross-section at the evaporator section is smaller than that of the second through hole at the condenser section.

The wick is made by sintering nano-size metal powders. The void spaces in the wick are nano-sized.

According to the heat pipe of the present invention, due to the plurality of first through holes defined in the wick in the evaporator section of the heat pipe, the wick comprises larger evaporator surface area. Thus, the containing amount of the working fluid at the evaporator section becomes larger. On the other hand, the wick is made by sintering the nano-scale metal powders and has nano-scale void spaces. Therefore, the preferred embodiment of the present invention provides a heat pipe with performances of low thermal resistance, high heat transfer and evaporator surface area, high capillary force and heat transfer capacity.

DETAILED DESCRIPTION OF THE INVENTION

Reference will now be made to the drawings to describe the preferred embodiments in detail.

Figure 1:
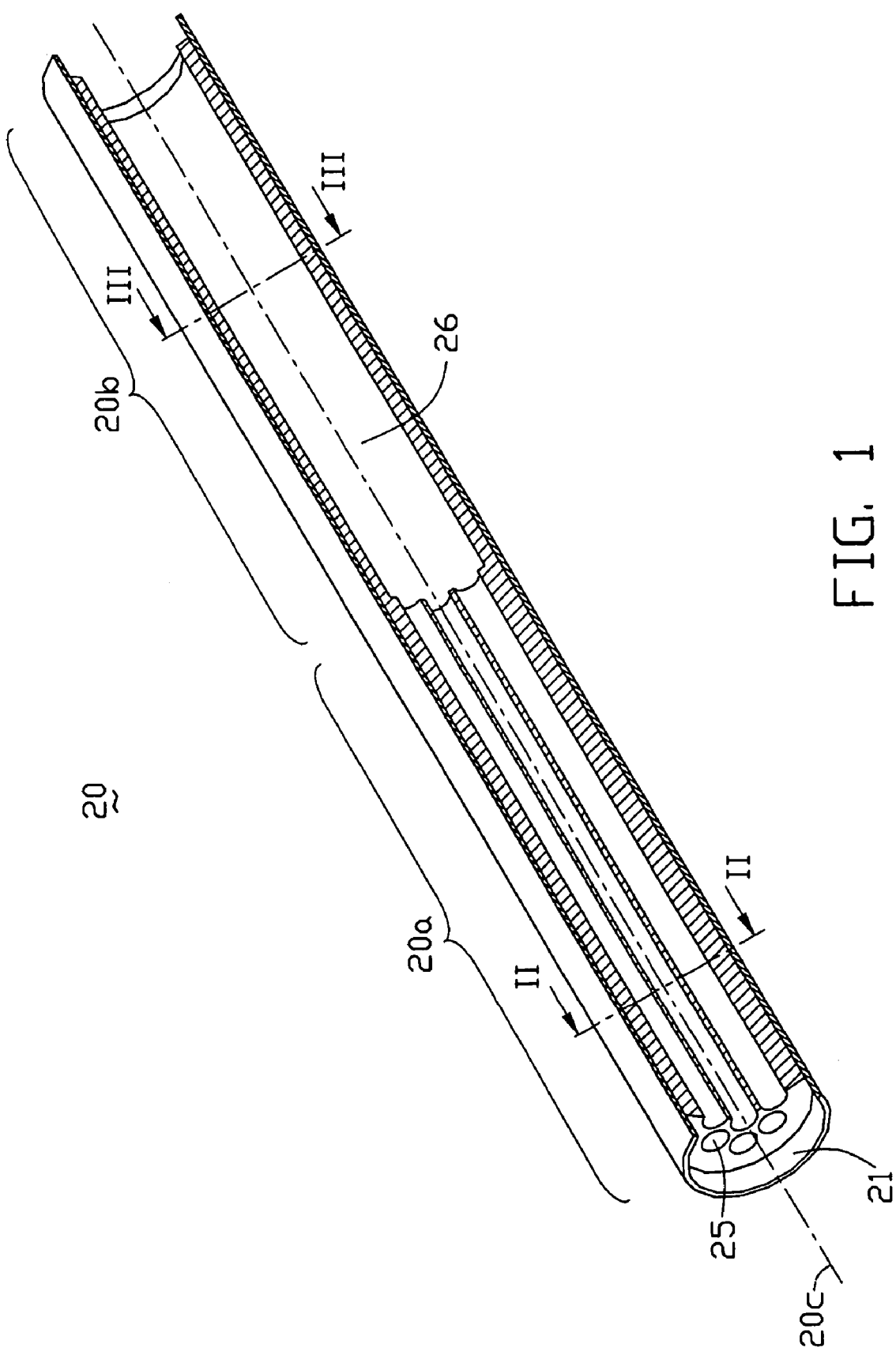
FIG. 1 is an isometric, cut-away view of a heat pipe in accordance with an embodiment of the present invention.
Figure 2:
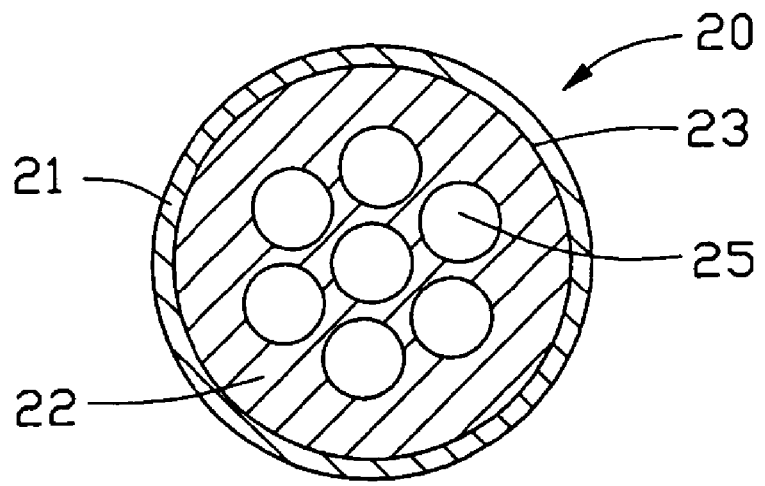
FIG. 2 is a cross-sectional view of the heat pipe taken along line II—II of FIG. 1.
Figure 3:
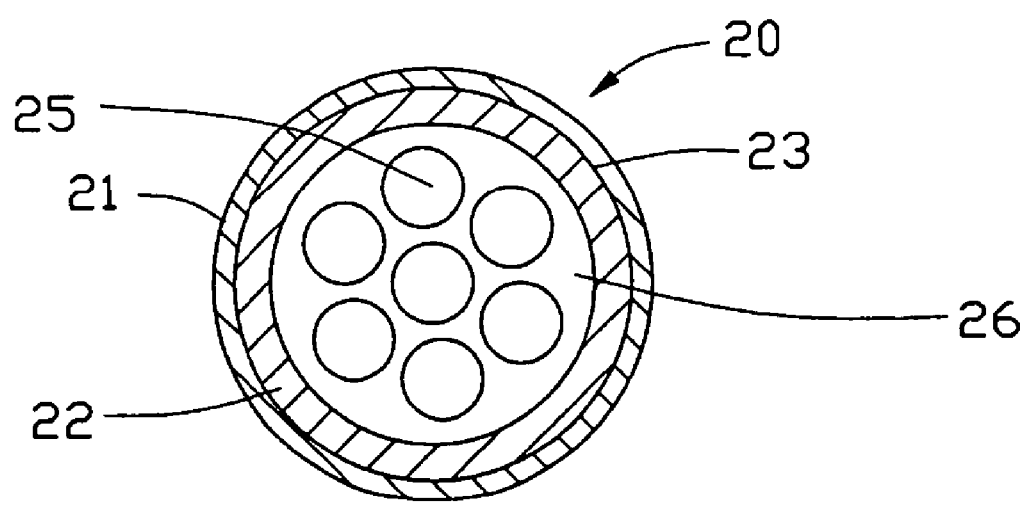
FIG. 3 is a cross-sectional view of the heat pipe taken along line III—III of FIG. 1.
Figure 4:
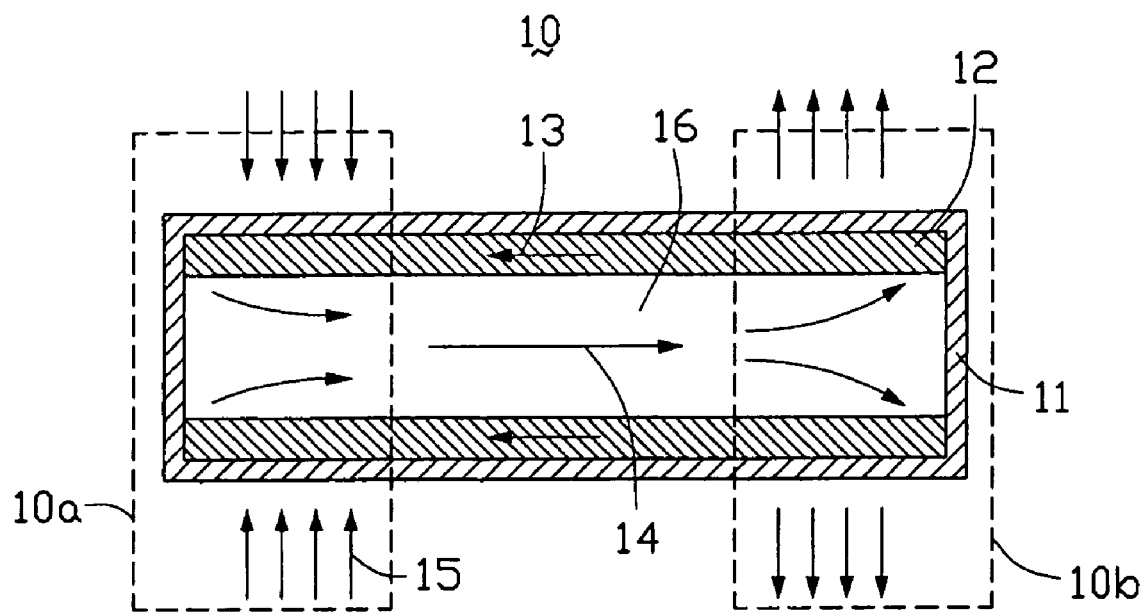
FIG. 4 is a schematic, side cross-sectional view of a conventional heat pipe.
Figure 5:
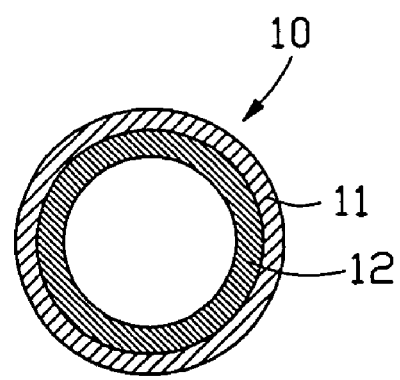
FIG. 5 is a schematic, transverse cross-sectional view of the heat pipe of FIG. 4.

Referring to FIGS. 1, 2 and 3, a heat pipe 20 of a preferred embodiment includes a pipe 21, a structure of a wick 22 formed on an inner wall 23 of the pipe 21, and a working fluid (not shown) sealed in the pipe 21 and soaked in the wick 22. The heat pipe 20 further includes an evaporator section 20a in the thermal contact with an outer heat source to vaporize the working fluid from an originally liquid state thereof and a condenser section 20b in the thermal contact with a heat dissipation device like a heat sink to condense the vaporized working fluid back to the liquid state thereof. A plurality of first through holes 25 are defined in the wick 22 in the evaporator section 20a of the heat pipe 20. A central one of the first through holes 25 is aligned along an axis 20c of the heat pipe 20, and the other first through holes 25 are parallel to the axis 20c. A second through hole 26 is defined in the wick 22 in the condenser section 20b of the heat pipe 20. The second through hole 26 is aligned along the axis 20c, and communicates with the first through holes 25. A radius of the first through holes 25 is smaller than that of the second through hole 26.

The pipe 21 may be made from copper, aluminum, steel, carbon steel, stainless steel, iron, nickel, titanium, or any alloy of these materials. A cross-sectional shape of the pipe 21 may be formed into a desired shape according to actual need. For example, the shape may be circular, square, triangular, trapezoidal, or semicircular.

In alternative embodiments, a cross-sectional shape of the first through holes 25 may be square, triangular, trapezoidal, or semicircular. In such cases, a cross-sectional width of the first through holes 25 at the evaporator section 20a is smaller than a diameter of the second through hole 26 at the condenser section 20b.

The wick 22 is formed by sintering nano-size metal powder disposed inside the pipe 21, such that void spaces (not shown) in the wick 22 have sizes in the range from 1 to 100 nanometers. An average grain size of the metal powder is in the range from 1 to 100 nanometers. The metal powder is selected from the group consisting of copper powder, aluminum powder, and iron powder.

The working fluid in the heat pipe 20 is selected from the group consisting of pure water, ammonia water, alcohol, acetone, and heptane. The working fluid may include thermally conductive particles suspended therein, for improving the thermal conductivity of the working fluid. The thermally conductive particles may be copper powder or carbon nano-materials.

While an embodiment has been illustrated and numerous embodiments have been described, various modifications and improvements can be made thereto by persons skilled in the art. The embodiments are described for illustrative not restrictive purposes. It is intended that the present embodiments not be limited to the particular form or forms illustrated, and that all modifications which maintain the spirit and realm of the present invention are within the scope of the present invention as defined in the appended claims.

What is claimed is:

1. A heat pipe comprising:
   a pipe;
   a wick provided at an inner wall of the pipe; wherein void spaces in the wick have sizes in range from 1 to 100 nanometers; and
   a working fluid sealed in the pipe and soaked in the wick, wherein a plurality of first through holes are defined in the wick in an evaporator section of the heat pipe, and a second through hole is defined in the wick in a condenser section of the heat pipe, the second through hole communicating with the first through holes.

2. The heat pipe as claimed in claim 1, wherein the wick is a sintered nano-structure of metal powder.

3. The heat pipe as claimed in claim 2, wherein the metal powder is selected from the group consisting of copper powder, aluminum powder, and iron powder.

4. The heat pipe as claimed in claim 3, wherein an average grain size of the metal powder is in the range from 1 to 100 nanometers.

5. The heat pipe as claimed in claim 1, wherein a cross-sectional shape of the pipe is selected from the group consisting of a circular shape, a square shape, a triangular shape, a trapezoidal shape, and a semicircular shape.

6. The heat pipe as claimed in claim 1, wherein a cross-sectional shape of the first through holes is selected from the group consisting of a circular shape, a square shape, a triangular shape, a trapezoidal shape, and a semicircular shape.

7. The heat pipe as claimed in claim 1, wherein a radius of the first through holes at the evaporator section is smaller than a radius of the second through hole at the condenser section.

8. The heat pipe as claimed in claim 1, wherein the working fluid is selected from the group consisting of pure water, ammonia water, alcohol, acetone, and heptane.

9. The heat pipe as claimed in claim 1, wherein the working fluid includes thermally conductive particles suspended therein.

10. The heat pipe as claimed in claim 9, wherein the thermally conductive particles are selected from the group consisting of copper powder and carbon nano-materials.

11. A heat pipe comprising:
    a pipe sealedly enclosing said heat pipe;
    a vaporizable working fluid secured in said pipe, and movable between a first section of said pipe where said working fluid in an original state vaporizes to gain heat from an outer heat source, and a second section of said pipe where said vaporized working fluid condenses back to said original state thereof to release said heat to a heat dissipation device in thermal contact with said second section of said pipe; and
    a wick structure attachable to an inner wall of said pipe and containable with said working fluid in said original state thereof for driving said working fluid in said original state thereof from said second section to said first section, portions of said wick structure containing said working fluid in said original state thereof being disposed significantly away from said inner wall of said first section so as to provide extra vaporizable surfaces for said working fluid in said original state thereof in said first section of said pipe, and void spaces inside said wick structure have sizes in the range from 1 to 100 nanometers.

12. The heat pipe as claimed in claim 11, wherein said portions of said wick structure containing said working fluid in said original state thereof are located in a close vicinity of a central axis of said first section of said pipe.

13. The heat pipe as claimed in claim 11, wherein said portions of said wick structure containing said working fluid in said original state thereof are located beside a plurality of through holes parallel extending along and in said first section without significantly spatial communication with each other.

14. The heat pipe as claimed in claim 11, wherein said wick structure is a sintered nano-structure of metal powder.

15. A method to manufacture a heat pipe, comprising the steps of:

enclosing said heat pipe by means of a sealed, hollow pipe;

installing a vaporizable working fluid in said pipe so that said vaporizable working fluid is movable between a first section of said pipe where said working fluid in an original state vaporizes by gaining outside heat of said pipe, and a second section of said pipe where said vaporized working fluid condenses back to said original state thereof to release said heat out of said pipe; and arranging a wick structure for driving said working fluid in said original state thereof from said second section to said first section in said pipe so that a plurality of separate first spaces for mainly containing said vaporized working fluid is defined in said first section, and a second space, capable of being in communication with each of said plurality of first spaces for mainly containing said vaporized working fluid, is defined in said second section, wherein said wick structure is a sintered nano-structure of metal powder.

16. The method as claimed in claim 15, wherein said each of said plurality of first spaces is formed by a first through hole extending in said first section toward said second section, and said second space is formed by a second through hole, having a cross sectional area larger than said first through hole, extending in said second section toward said first section.

17. The method as claimed in claim 15, wherein void spaces inside said wick structure other than said plurality of first spaces and said second space are arranged to have sizes in the range from 1 to 100 nanometers.

18. The method as claimed in claim 15, wherein an average grain size of said metal powder is in the range from 1 to 100 nanometers.

* * * * *